United States Patent
Wang

(12) 
(10) Patent No.: US 6,288,616 B1
(45) Date of Patent: Sep. 11, 2001

(54) MULTIFREQUENCY LOW-POWER OSCILLATOR FOR TELECOMMUNICATION IC'S

(75) Inventor: Zhenhua Wang, Zurich (CH)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/571,455

(22) Filed: May 16, 2000

(30) Foreign Application Priority Data

May 19, 1999 (EP) .................................................. 99201578

(51) Int. Cl.$^7$ ...................................................... H03B 5/24
(52) U.S. Cl. .................................. 331/57; 331/34; 331/60; 331/74; 331/177 R; 331/185
(58) Field of Search ................................ 331/34, 57, 60, 331/74, 143, 177 R, 185, 186

(56) References Cited

U.S. PATENT DOCUMENTS

| | | | |
|---|---|---|---|
| 2,642,526 | * 6/1953 | Gallay | 331/57 |
| 5,262,735 | 11/1993 | Hashimoto et al. | 331/45 |
| 5,844,447 | 12/1998 | Choi | 331/57 |

FOREIGN PATENT DOCUMENTS

3634594A1    4/1988   (DE) ................................ H03K/3/02

OTHER PUBLICATIONS

By Sugimoto Y. et al.: Entitled: "Study of Low Voltage, Low Power and High Frequency CMOS VCO Circuit", IEICE Transactions of Fundamentals on Electronics, Communications and Computer Sciences, JP, Institute of Electronics Information and Comm. Eng. Tokyo vol. E79–A, No. 5 May 1, 1996 pp. 630–633.

By Sugimoto Y. et al: Entitled "Design of a Low–Voltage Low Power High–Frequency CMOS Current–Mode VCO Circuit by Using 0.6 MUM MOS Devices", IEICE Transactions of Fundamental of Electronics, Communications and Computer Sciences, JP, Institute of Electronics Information and Comm. Eng. Tokyo, vol. E80–A, No. 2, Feb. 1, 1997, pp. 304–311.

* cited by examiner

Primary Examiner—David Mis

(57) ABSTRACT

An oscillator circuit is provided with delay cells having supply voltage terminals and being interconnected in a ring for providing a first oscillator signal. If the delay cells have supply voltage terminals in common a second oscillator signal can derived from the respective common supply voltage terminals. The first ring oscillator signal, which is possibly available in quadrature, has a low frequency providing a low power consumption to the oscillator circuit. The two highly sinusoidal oscillator signals are generated simultaneously and have a frequency, whose ratio depends on the number of delay cells in the oscillator circuit. The oscillator circuit can be easily implemented on a limited chip area for application in transmitters/receivers operating in the GHz range.

10 Claims, 2 Drawing Sheets

MULTIFREQUENCY LOW-POWER OSCILLATOR FOR TELECOMMUNICATION IC'S

The present invention relates to an oscillator circuit provided with delay cells having supply voltage terminals and being interconnected in a ring for providing an oscillator signal.

The present invention also relates to a voltage controlled oscillator (VCO), a phase locked loop (PLL), an integrated circuit (IC), and a telecommunication device, as outlined in the claims 6, 7, 8 and 9 respectively.

DE-OS-3634594 discloses a multifrequency oscillator shown in FIG. 1 thereof, providing a first oscillator signal f(0), whereas additional oscillator signal frequencies (f) are being derived by means of a controllable switch from taps interconnecting delay cells arranged in a ring. Such an extensive oscillator is relatively slow, consumes a lot of power, and is not suited for very high frequency telecommunication applications.

An oscillator circuit acknowledged in the preambles of the aforementioned claims is disclosed in U.S. Pat. No. 5,844,447. The known oscillator circuit includes a first ring oscillator having inverters coupled to a first buffer, and a second ring oscillator having delay cells coupled to a second buffer. Each delay cell consists of a PMOS transistor and an NMOS transistor which are easy to be fully integrated on a chip. The first buffer output produces a first waveform having a high frequency and the second buffer output produces a second waveform having a lower frequency. It is generally known that the maximum achievable frequency of a ring oscillator is inversely proportional to the number of delay cells therein. This however restricts the application capabilities of a ring oscillator having several of such delay cells for use in the GHz range, such as common in nowadays telecommunication devices, in particular mobile telephones, pagers etcetera. In addition power consumption of these devices increases with an increasing user frequency. Therefore these known ring type oscillators circuits are less suitable for use in very high frequency range circuitry.

However it is an object of the present invention to provide a cost effective oscillator circuit which is simple, easy to be integrated on a small chip area, suitable for application in the GHz range, but nevertheless has a very low power consumption.

Thereto the oscillator circuit of the present invention is characterized in that the delay cells have supply voltage terminals in common, which terminals are coupled to the supply through coupling means for providing a further oscillator signal derived from the respective common supply voltage terminals.

It is an advantage of the present invention that the oscillator circuit operates at the relatively low frequency of the oscillator signal, whereas the further oscillator signal frequency is synthesized to be higher. However the lower operating frequency determines the lowered power consumption, which is especially important for mobile equipment and communication appliances. In practice a very low current consumption could be combined with a supply voltage of only a few volts. It should be noted that contrary to the conventional way of thinking the approach presented starts from the notion that, if at first the low frequency oscillator signal is being generated the further high frequency oscillator signal is acquired for free without requiring power or substantial hardware. A variety of coupling means may are applicable for the man skilled in the art. The coupling means may for example contain: a current source, a current measuring or converting device, one or more current mirrors or an impedance element, which in the most simple case is a resistor.

In addition the oscillator circuit of the invention is even capable of providing two oscillator signals simultaneously, which signals also have different frequencies. This simplifies the circuitry, reduces the necessary IC chip area and makes the circuit particularly but not necessarily exclusively useful for application in multistage—possibly double balanced—mixer circuits, such as in heterodyne transmitters, receivers and/or transceivers, like for GSM, Dect or pagers. Moreover the inventor established to compose an oscillator circuit, where the maximum achievable frequency fmax of the further oscillator signal does no longer (inversely proportional) depend on the number N of delay cells applied in the circuit as noted earlier. In fact fmax is made even fully independent from N. Besides it is noted that each of the oscillator signals is highly sinusoidal, and that consequently the power supply is not loaded with supply spikes, resulting in a stabile and static-free operation of the novel and inventive oscillator circuit.

An embodiment of the oscillator circuit of the present invention is characterized in that the even numbered delay cells are coupled to the one common supply voltage terminal, whereas the odd numbered delay cells are coupled to the other common supply voltage terminal. Advantageously the relation f1=N×f2 holds for the oscillator circuit of the invention, wherein f1 is the frequency of the high frequency further oscillator signal and f2 is the frequency of the low frequency oscillator signal. In practice N will be even, that is 2, 4, 6, 8 . . . resulting in reliable integer values of possible frequency ratios, fully controlled by the number N of delay cells and suitable for a variety of applications and frequencies. If N increases the frequency difference between both oscillator signals increases, such that a higher achievable first oscillator frequency is being combined with a lowered power consumption because the power consumption is determined by the lower second oscillator frequency.

Another embodiment of the oscillator circuit according to the invention is characterized in that the number N of delay cells is even and is equal or larger than 4. Advantageously two oscillator frequencies are available simultaneously with f1=N×f2, whereas the oscillator signal having frequency f1 is available in differential form and the oscillator signal having frequency f2 is even available in quadrature form.

A further embodiment of the oscillator circuit according to the invention is characterized in that if each delay cell has a propagation delay δ, it holds for the further oscillator signal frequency f1 that it equals 1/(2δ). Such an embodiment with preferably identical delay cells is particularly easy to integrate and may provide a very high frequency f1 if δ is made very small.

In its simplest embodiment a delay cell is an inverter, in particular a digital inverter, such that the low frequency oscillator signal is available in quadrature form, if N=4, 8 . . . , which is particular suited for heterodyne transmitters/receivers with digital modulation.

Of the possible technologies for implementing the oscillator circuit according to the invention on a chip IC area, such as GaAs or bipolar, CMOS has proven to be the most cost effective process.

At present the oscillator circuit according to the invention will be elucidated further together with its additional advantages, while reference is being made to the appended drawing, wherein similar components are being referred to by means of the same reference numerals. In the drawing.

Figure 1:
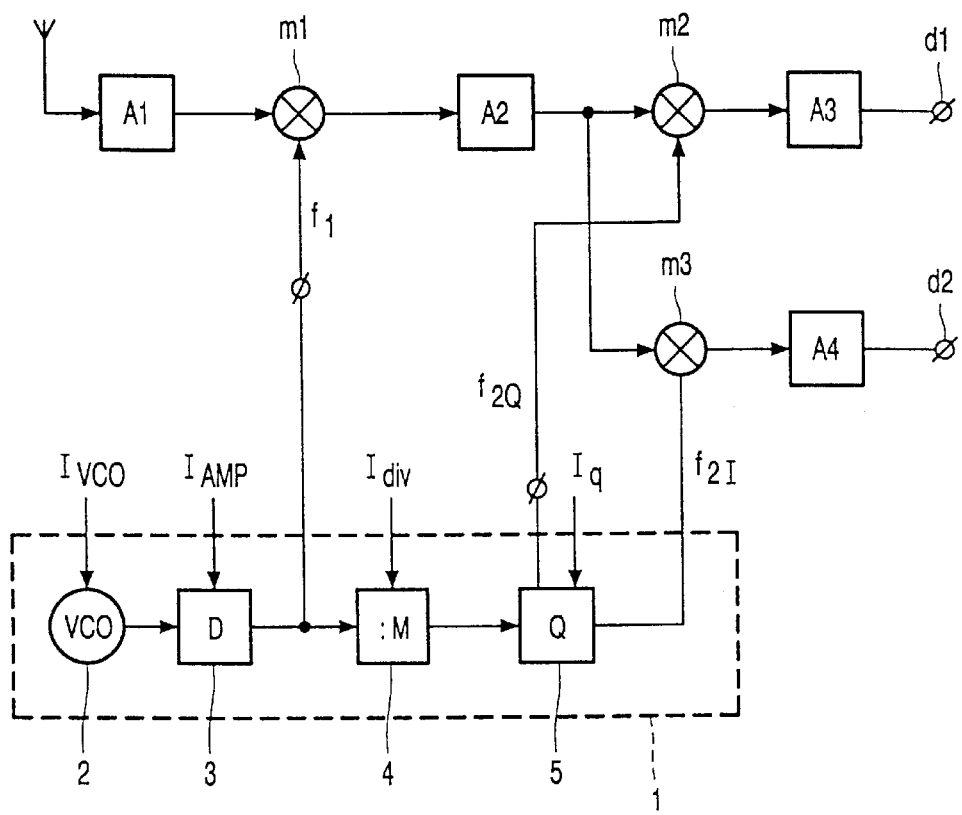
FIG. 1 shows a known heterodyne receiver having a prior art local oscillator circuit.

FIG. 1 shows a prior art local oscillator circuit 1, comprising a voltage controlled oscillator (VCO) 2, which is coupled to a buffer/amplifier 3 for providing a first high frequency oscillator signal to a terminal f1, which in turn is connected to a frequency dividing circuit 4 (having divisor M) and possibly to a quadrature circuit 5 for outputting a quadrature second oscillator signal f2 having a frequency, which is lower than the high frequency of the first oscillator signal. Such a circuit 1 can be applied in a well known heterodyne for example radio receiver architecture, schematically shown to contain an antennae and filter amplifiers A1–A4, wherein a received radio signal is down converted in two mixer stages m1; m2,m3 to a base band data or audio signal on terminals d1 and d2. To these mixer stages the two oscillator signals f1 and f2 are supplied. The current consumption of the circuit 1 can be totalised as to contain the current components:

$$Ivco(f1)+Iamp(f1)+Idiv(f1)+Iq(f1/M) \quad (1)$$

wherein the quotation placed between brackets indicates a dependency on the high frequency f1. Thus the higher f1 is, the higher the current consumption will be. Present day communication takes place in the GHz range with a consequent high consumption of power.

Figure 2:
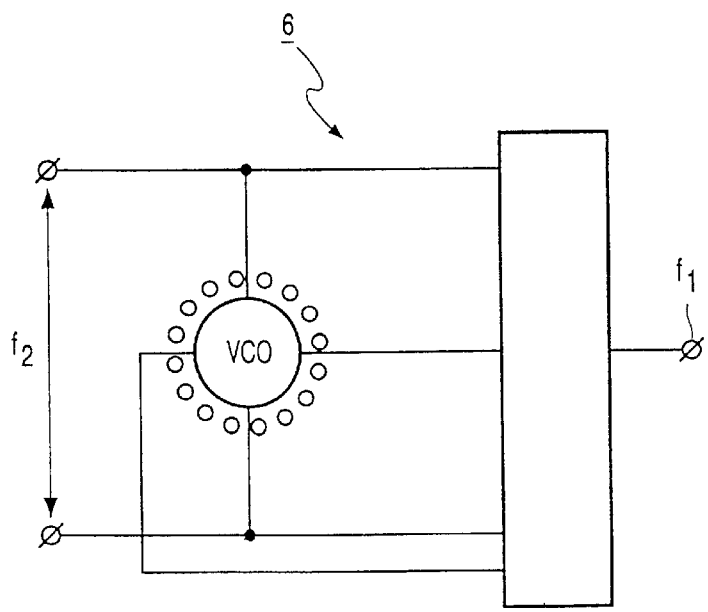
FIG. 2 shows a basic scheme of the oscillator circuit according to the present invention.

FIG. 2 shows a basic scheme of an oscillator circuit 6 having a substantially lower power consumption. This is because a ring delay cell arrangement included in the circuit 6 oscillates on a relatively low frequency f2 from which the higher frequency signal f1 is simply being derived. Now the current consumption of the circuit 6 replacing the circuit 1 in FIG. 1 can be totalised as to contain the current components:

$$Ivco(f2)+Iamp(f2)$$

which is considerably less than relation (1) indicates, because of the fewer terms in the relation and because both terms show a dependency from only the lower frequency f2.

Figure 3:
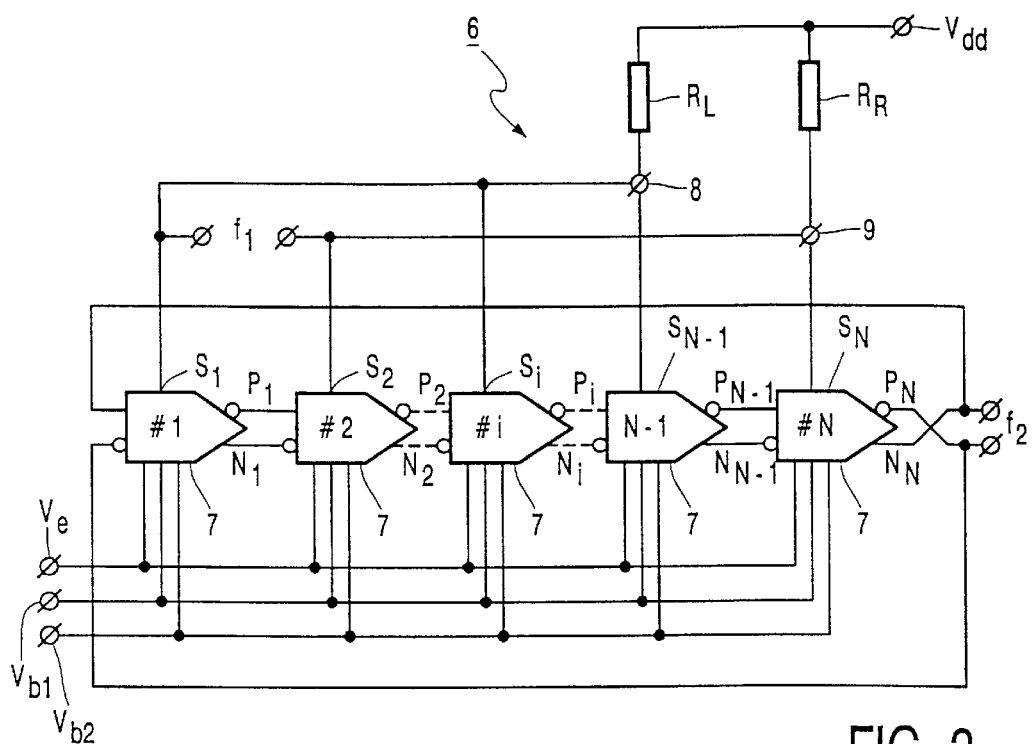
FIG. 3 shows a generalization of possible embodiments of the oscillator circuit of FIG. 2, which is voltage controlled.
Figure 4:
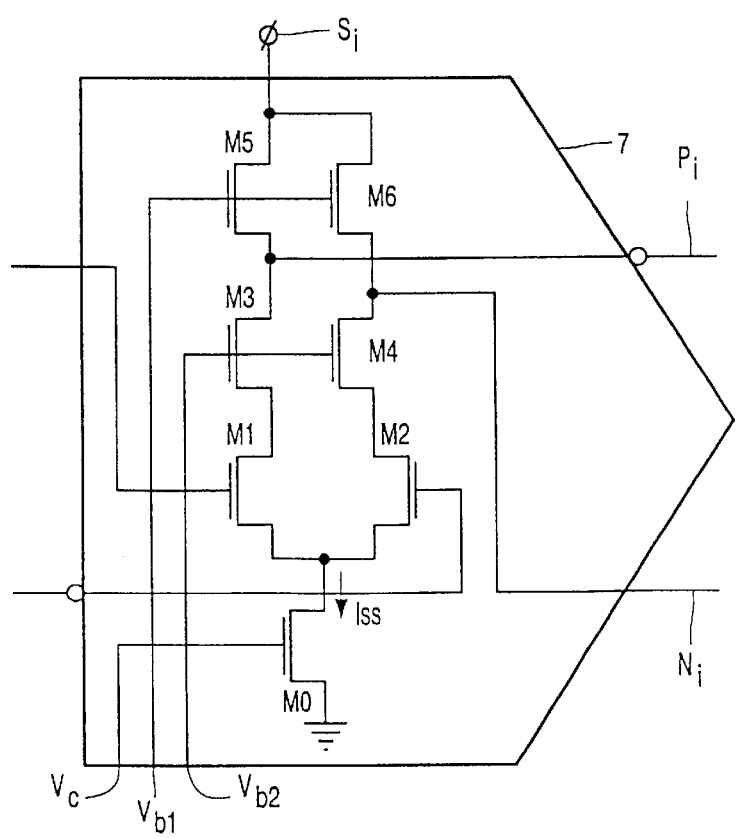
FIG. 4 shows a possible embodiment of a delay cell for application in the oscillator circuit of FIG. 3.

FIG. 3 shows a generalization of possible embodiments of the oscillator circuit 6. The circuit 6 may have from two delay cells 7 (but then it only provides one oscillator output signal); if it has four or more —but an even number of—cells signals having different frequencies are being generated in a way to be explained hereafter. Such delay cells 7 may as generally known in the relevant art for example be embodied as shown in FIG. 4. The delay cells 7 contain transistors, such as for example of the GaAs, bipolar, but preferably of the CMOS, PMOS and/or NMOS type. In a differential built up the cell contains a tail transistor M0 controlling two parallel branches containing transistors M1–M6 ending in terminals Si. At wish M3 and M4 could be dispensed with.

FIG. 3 elucidates delay cells 7 of the type of FIG. 4(a), wherein the oscillator circuit 6 contains external loads in the form of simple resistors RL and RR coupled to supply voltage terminals 8 and 9 respectively. Generally the load resistors may be, either or not on-chip, coupling means such as a current source, a current measuring or converting device, one or more current mirrors or an impedance element. Terminal 8 is coupled to the odd-numbered delay cells, whereas terminal 9 is coupled to the even-numbered delay cells, both through the respective terminals Si. A connection Pi (i=1 ... N−1) connects an inverting output of cell #i to a non-inverting input of cell #i+1, and connection Ni (i=1 ... N−1) connects a non-inverting output of cell #i to an inverting input of cell #i+1. However output PN is connected to the non inverting input of cell #1, whereas output NN is connected to the non-inverting input of cell #1. Terminals Vc, Vb1, and Vb2 supply control voltages for the cells 7. The ring oscillator circuit 6 thus oscillates on a low frequency f2 to be taken from PN and NN, and the high frequency f1 can be taken from terminals 8 and 9. The relation f1=N×f2 holds. In fact supply voltage terminals 8 and 9 each continuously add up the supply currents through the respective delay cells, so that the oscillator signal there between is arithmetically synthesized in a simple, less power consuming and highly sinusoidal way. The signals on P1, N1; P2, N2, ... all have an equal frequency, but their phases differ mutually. Oscillator signal f1 is in a differential form, whereas f2 is even available in quadrature form, e.g. if N=4, if the I and Q signals are then taken from delay cell outputs, which are N/2=2 delay cells apart from each other. Therefore both oscillator signals are without modification usable in for example a heterodyne radio architecture, such as the one shown in FIG. 1. However even in case only the high frequency signal is being used for example in a low-IF or zero-IF architecture power can still be saved due to the low oscillating frequency, which determines these savings.

Mostly as shown in FIG. 4 the tail transistor Mo is used to tune the oscillating frequency f2 of the ring. This is achieved by controlling the voltage Vc on the gates of respective M0 transistors in each cell 7. If Vc increases the delay time δ is reduced and f2 increases and so does f1. It can be shown that the maximum achievable frequency fmax of the signal between terminals 8 and 9 is given by the relation:

$$fmax=1/(2\delta min)$$

wherein δmin is the minimum delay time of the delay cells used and wherein fmax does not depend on the number of delay cells N.

By way of example it is noted that a voltage controlled oscillator circuit is developed wherein N=4, which consumed only 328 µA with a supply voltage of 2 Volt. Such a VCO could for example be applied in a PLL such as disclosed in DE-OS-3634594 mentioned before. Several variations are feasible for the man skilled in the art, such as the taking of a still further signal from other or another combination of terminals Pi, Ni or from other terminals Si for deriving f1 there from. Of course the oscillator could be applied in a variety of devices, telecommunication devices, such as telephones, mobile telephones, pagers, transmitters, receivers, transceivers, mostly integrated on chips and usable in for example a VCO and/or PLL.

What is claimed is:

1. An oscillator circuit provided with delay cells having supply voltage terminals and being interconnected in a ring for providing an oscillator signal, characterized in that the delay cells have supply voltage terminals in common, which terminals are coupled to the supply through coupling means for providing a further oscillator signal at the respective common supply voltage terminals.

2. The oscillator circuit according to claim 1, characterized in that the even numbered delay cells are coupled to a first common supply voltage terminal, whereas the odd numbered delay cells are coupled to a further common supply voltage terminal.

3. The oscillator circuit according to claim 1, characterized in that the number N of delay cells is even and is equal or larger than 4.

4. The oscillator circuit according to claim 1, characterized in that if each delay cell has a propagation delay δ, it holds for the further oscillator signal frequency f1 that it equals 1/(2δ).

5. The oscillator circuit according to claim 1, characterized in that the delay cell is embodied as an inverter, in particular a digital inverter.

6. The oscillator circuit according to claim 1, characterized in that the oscillator circuit is implemented in CMOS, GaAs or bipolar technics.

7. A voltage controlled oscillator provided with an oscillator circuit according to claim 1.

8. A phase locked loop provided with a voltage controlled oscillator according to claim 7.

9. An integrated circuit provided with an oscillator circuit according to claim 1, and/or a voltage controlled oscillator according to claim 7, and/or a phase locked loop according to claim 8.

10. A telecommunication device, such as a transmitter, a receiver in particular an heterodyne receiver, a mobile telephone, a pager or the like provided with an integrated circuit according to claim 9.

* * * * *